(12) United States Patent
Ranish et al.

(10) Patent No.: US 10,376,916 B2
(45) Date of Patent: Aug. 13, 2019

(54) SUBSTRATE PROCESSING SYSTEM HAVING SUSCEPTORLESS SUBSTRATE SUPPORT WITH ENHANCED SUBSTRATE HEATING CONTROL

(71) Applicant: APPLIED MATERIALS, INC., Santa Clara, CA (US)

(72) Inventors: Joseph M. Ranish, San Jose, CA (US); Kailash Patalay, San Jose, CA (US)

(73) Assignee: APPLIED MATERIALS, INC, Santa Clara, CA (US)

( * ) Notice: Subject to any disclaimer, the term of this patent is extended or adjusted under 35 U.S.C. 154(b) by 61 days.

(21) Appl. No.: 15/604,900

(22) Filed: May 25, 2017

(65) Prior Publication Data

US 2017/0259294 A1    Sep. 14, 2017

Related U.S. Application Data

(62) Division of application No. 13/788,573, filed on Mar. 7, 2013, now Pat. No. 9,682,398.

(60) Provisional application No. 61/617,873, filed on Mar. 30, 2012.

(51) Int. Cl.
| | |
|---|---|
| *B05C 13/00* | (2006.01) |
| *H01L 21/67* | (2006.01) |
| *H01L 21/687* | (2006.01) |
| *C30B 23/02* | (2006.01) |
| *C30B 35/00* | (2006.01) |

(52) U.S. Cl.
CPC .............. *B05C 13/00* (2013.01); *C30B 23/02* (2013.01); *C30B 35/00* (2013.01); *H01L 21/67115* (2013.01); *H01L 21/68735* (2013.01)

(58) Field of Classification Search
USPC .............................. 219/390, 405; 269/289 R
See application file for complete search history.

(56) References Cited

U.S. PATENT DOCUMENTS

| | | |
|---|---|---|
| 5,304,248 A | 4/1994 | Cheng et al. |
| 6,146,504 A | 11/2000 | Patadia et al. |
| 6,153,260 A | 11/2000 | Comita et al. |

(Continued)

FOREIGN PATENT DOCUMENTS

KR    10-0940544 B1    2/2010

OTHER PUBLICATIONS

International Search Report and Written Opinion dated Jul. 18, 2013 for PCT Application No. PCT/US2013/033336.

(Continued)

*Primary Examiner* — Joseph J Hail
*Assistant Examiner* — Brian D Keller
(74) *Attorney, Agent, or Firm* — Moser Taboada; Alan Taboada

(57) ABSTRACT

Methods and apparatus for processing substrates are provided herein. In some embodiments, an apparatus includes a process kit, the process kit comprising a first ring to support a substrate proximate a peripheral edge of the substrate; a second ring disposed about the first ring; and a path formed between the first and second rings that allows the first ring to rotate with respect to the second ring, wherein the path substantially prevents light from travelling between a first volume disposed below the first and second rings and a second volume disposed above the first and second rings.

12 Claims, 7 Drawing Sheets

(56) References Cited

U.S. PATENT DOCUMENTS

| | | |
|---|---|---|
| 7,520,969 B2 * | 4/2009 | Miller .............. H01J 37/32495 |
| | | 118/720 |
| 2002/0076490 A1 | 6/2002 | Chiang et al. |
| 2003/0015141 A1 | 1/2003 | Takagi |
| 2004/0060512 A1 * | 4/2004 | Waldhauer .......... C23C 16/4585 |
| | | 118/715 |
| 2008/0069951 A1 | 3/2008 | Chacin et al. |
| 2008/0141942 A1 * | 6/2008 | Brown ................. C23C 14/564 |
| | | 118/723 R |
| 2009/0025636 A1 | 1/2009 | Rasheed |
| 2010/0075488 A1 | 3/2010 | Collins et al. |
| 2011/0021031 A1 | 1/2011 | Taylor et al. |
| 2011/0116207 A1 | 5/2011 | Sato et al. |
| 2012/0003599 A1 | 1/2012 | Patalay et al. |
| 2012/0103257 A1 * | 5/2012 | Rasheed ................. C23C 14/50 |
| | | 118/715 |
| 2012/0213500 A1 | 8/2012 | Koelmel et al. |
| 2014/0175054 A1 | 6/2014 | Carlson et al. |

OTHER PUBLICATIONS

Search Report for Taiwan Patent Application No. 102108905 dated Feb. 19, 2017.

* cited by examiner

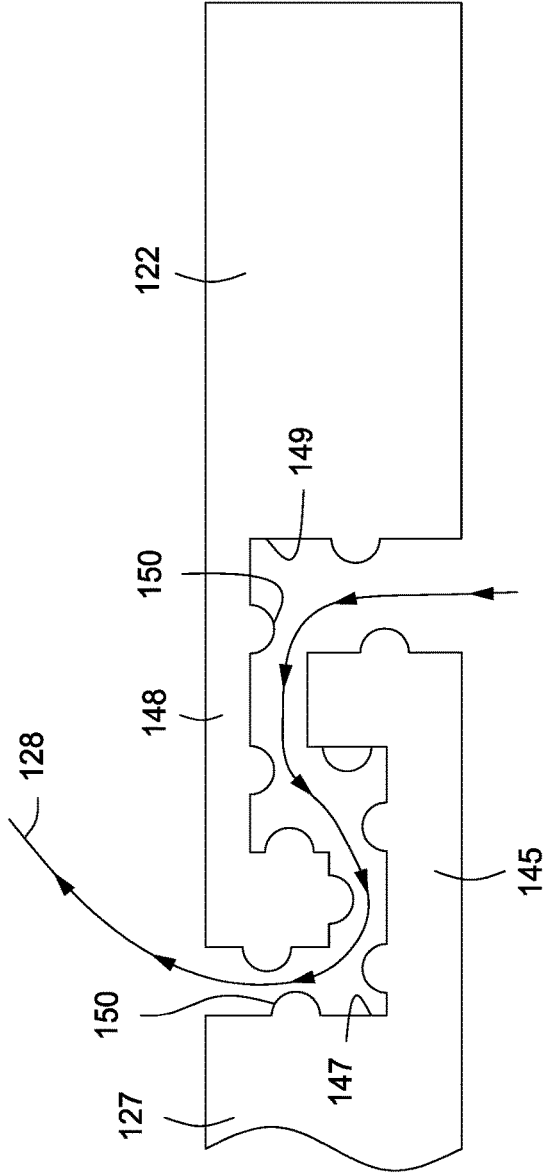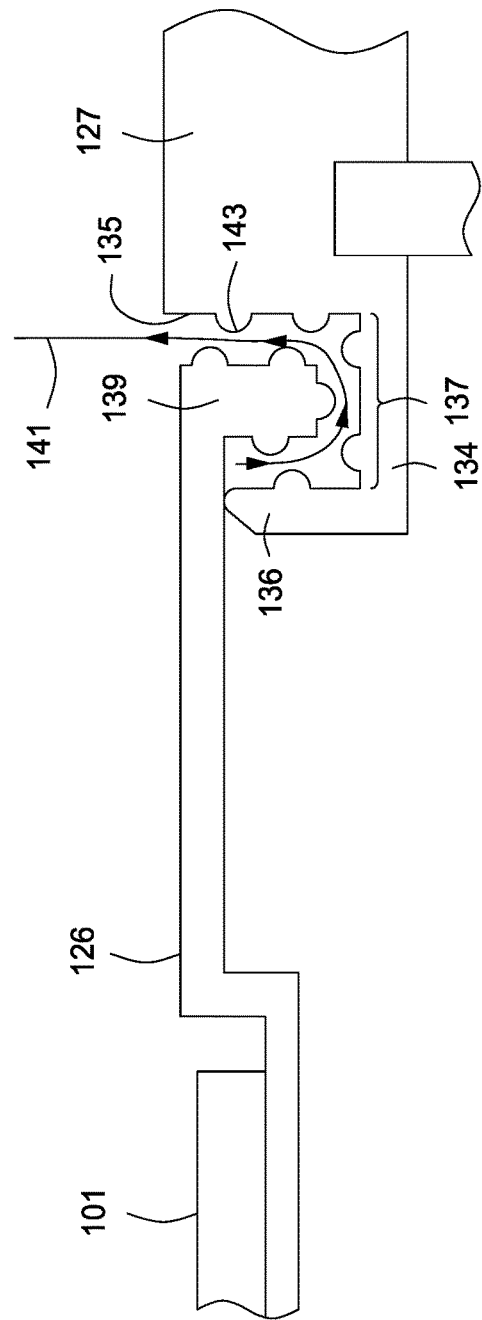

SUBSTRATE PROCESSING SYSTEM HAVING SUSCEPTORLESS SUBSTRATE SUPPORT WITH ENHANCED SUBSTRATE HEATING CONTROL

CROSS-REFERENCE TO RELATED APPLICATIONS

This application is a divisional of co-pending U.S. patent application Ser. No. 13/788,573, filed Mar. 7, 2013, which claims benefit of U.S. provisional patent application Ser. No. 61/617,873, filed Mar. 30, 2012. Each of the aforementioned related patent applications is herein incorporated by reference in its entirety.

FIELD

Embodiments of the present invention generally relate to substrate processing systems.

BACKGROUND

As the critical dimensions of devices continue to shrink, substrate processing systems require more sensitive control of heating, gas flow, and the like. The inventors have observed that substrate processing systems, for example, configured for epitaxial deposition processes, may achieve improved process control by using multi-zonal lamps without a susceptor plate to support the substrate, which can undesirably thermally average the multi-zonal heating effects.

Thus, the inventors have provided improved methods and apparatus for processing substrates.

SUMMARY

Methods and apparatus for processing substrates are provided herein. In some embodiments, an apparatus includes a process kit, the process kit comprising a first ring to support a substrate proximate a peripheral edge of the substrate; a second ring disposed about the first ring; and a path formed between the first and second rings that allows the first ring to rotate with respect to the second ring, wherein the path substantially prevents light from travelling between a first volume disposed below the first and second rings and a second volume disposed above the first and second rings.

In some embodiments, an apparatus includes a processing chamber having a substrate support comprising a first ring to support a substrate proximate a peripheral edge of the substrate; a second ring disposed about the substrate support; a lamphead to provide energy to a substrate when disposed on the substrate support; a temperature sensor opposing the lamphead to measure energy radiated from the substrate; and a path formed between the first and second rings that allows the first ring to rotate with respect to the second ring, wherein the path substantially prevents light from travelling between a first volume disposed below the first and second rings and a second volume disposed above the first and second rings.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 2A-D depict partial side schematic views of a substrate support in accordance with some embodiments of the present invention.

Figure 1:
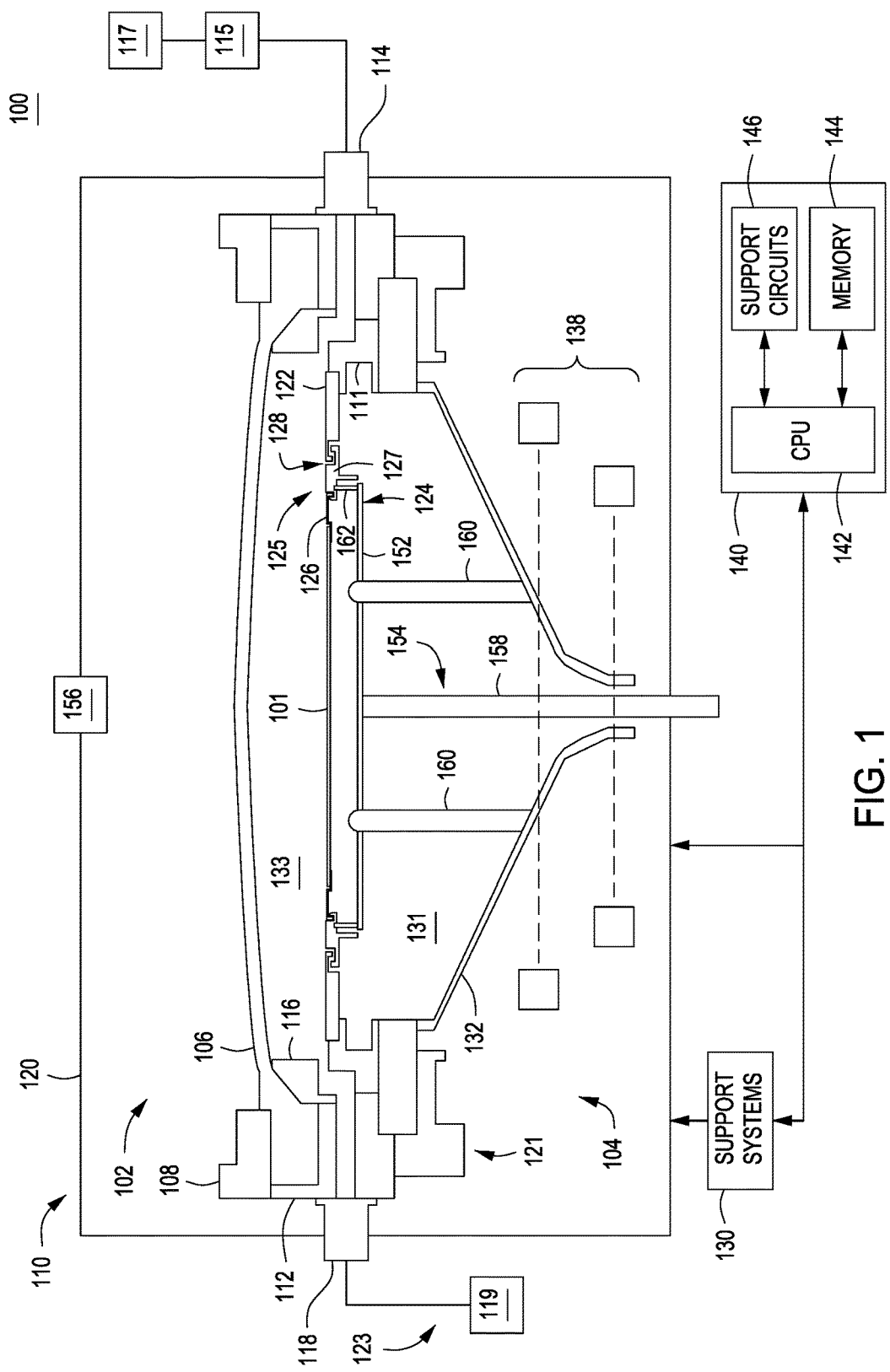
FIG. 1 depicts a schematic view of a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for processing substrates are provided herein. In some embodiments, the inventive apparatus may advantageously provide enhanced thermal control of a substrate in a substrate processing system that supports the substrate without a susceptor plate. Other and further embodiments of the present invention are discussed below.

Embodiments of the inventive methods and apparatus disclosed herein may be adapted for used in any suitable process chamber, including those adapted for performing epitaxial deposition processes, such as the RP EPI reactor, available from Applied Materials, Inc. of Santa Clara, Calif. An exemplary process chamber is described below with respect to FIG. 1, which depicts a schematic, cross-sectional view of a semiconductor substrate process chamber 100 in accordance with some embodiments of the present invention. The process chamber 100 may, for example, be adapted for performing epitaxial deposition processes and illustratively comprises a chamber body 110, support systems 130, and a controller 140. The process chamber depicted in FIG. 1 is illustrative only and other process chambers, including those configured for processes other than epitaxial deposition processes, may be modified in accordance with the teachings provided herein.

The chamber body 110 generally includes an upper portion 102, a lower portion 104, and an enclosure 120. A vacuum system 123 may be coupled to the chamber body 110 to facilitate maintaining a desired pressure within the chamber body 110. In some embodiments, the vacuum system 123 may comprise a throttle valve (not shown) and vacuum pump 119 which are used to exhaust the chamber body 110. In some embodiments, the pressure inside the chamber body 110 may be regulated by adjusting the throttle valve and/or vacuum pump 119. The upper portion 102 is disposed on the lower portion 104 and includes a lid 106, a clamp ring 108, a first liner 116, a baseplate 112, and an upper pyrometer 156. In some embodiments, the lid 106 has a dome-like form factor, however, lids having other form factors (e.g., flat or reverse curve lids) are also contemplated.

The lower portion 104 is coupled to a process gas intake port 114 and an exhaust port 118 and comprises a baseplate assembly 121, a lower dome 132, a substrate support 124, a pre-heat ring (e.g., second ring 122, discussed below), a lower liner 111, and a lamphead 138, which may include a plurality of lamps arranged in zones, wherein each zone of lamps is separately controllable. Although the term "ring" is used to describe certain components of the process chamber 100, such as the pre-heat ring, it is contemplated that the shape of these components need not be circular and may include any shape, including but not limited to, rectangles, polygons, ovals, and the like. A gas source 117 may be coupled to the chamber body 110 to provide one or more process gases thereto. In some embodiments, a purifier 115 may be coupled to the gas source 117 to filter or purify the one or more process gases prior to entering the chamber body 110.

Figure 2A:
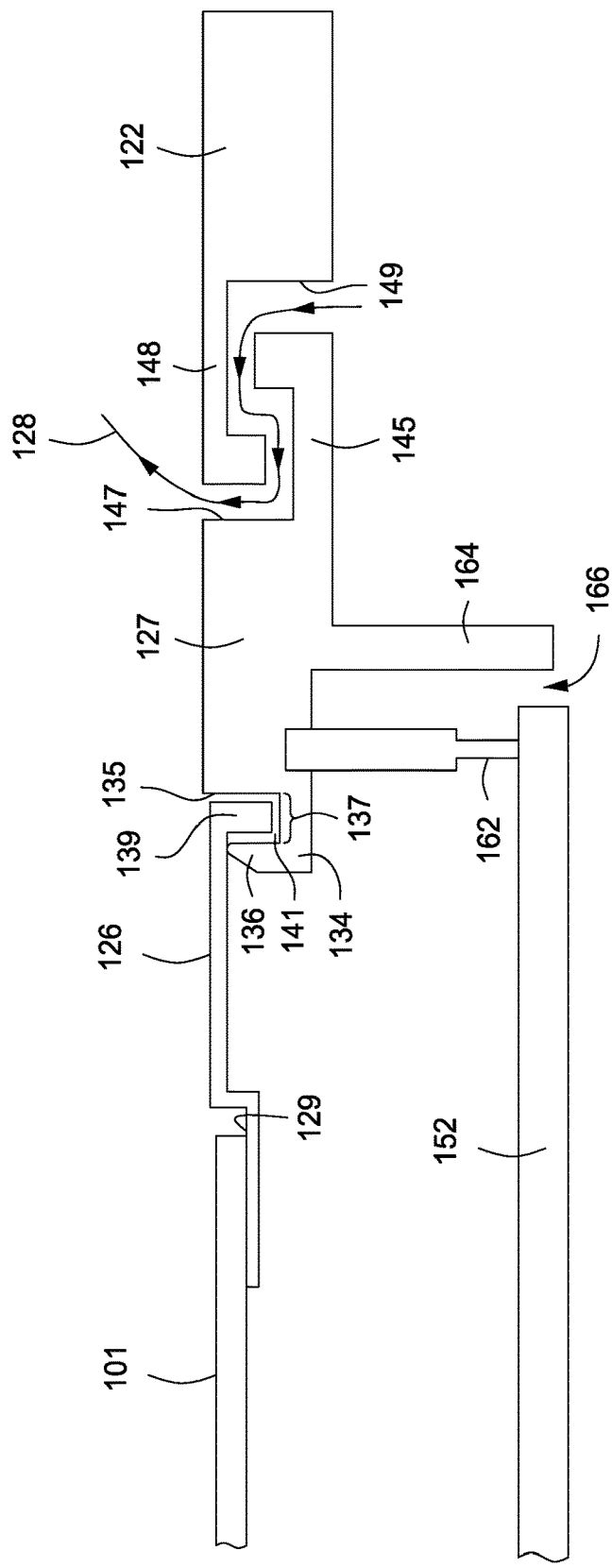
Figure 2B:
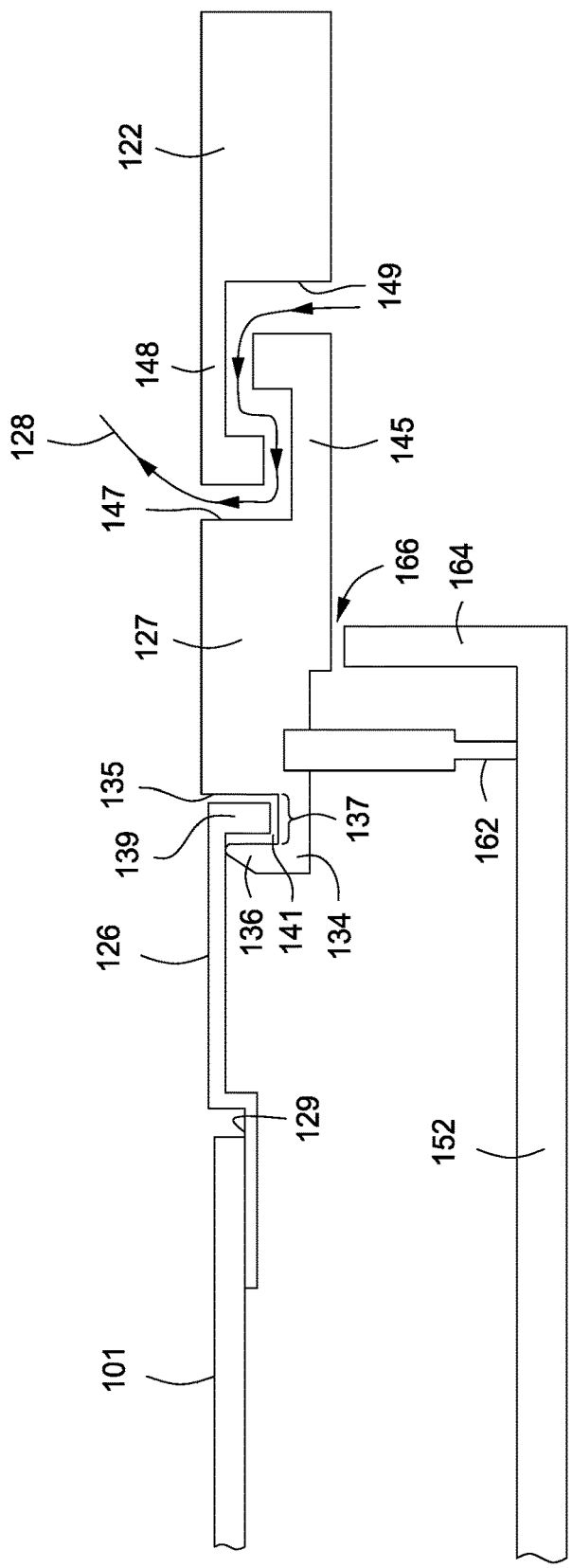

Some embodiments of a substrate support, such as the substrate support 124 are depicted in FIGS. 1 and 2A-2B. The substrate support 124 may include parts of a process kit 125 which may be adapted to work with various embodiments of substrate supports and/or process chambers. For example, the process kit 125 may include elements of the substrate support 124, such as a first ring 126 (e.g., an edge ring) and a third ring 127 (e.g., a support ring), and elements of the chamber, such as a second ring 122 (e.g., the pre-heat ring). The process kit 125 may include a path 128 formed between the first and second rings 126, 122. The path 128 may allow for rotation between the first and second rings 126, 122, such as when the substrate support 124 rotates during processing. The path 128 may be configured such that light from the lamphead 138 is limited (e.g., substantially prevented) or prevented from travelling via the path between a first volume 131 disposed below the first and second rings 126, 122 and a second volume 133 (e.g., a processing volume) disposed above the first and second rings 126, 122. Further, the path 128 may limit (e.g., substantially prevent) or prevent process gases utilized in the second volume 133 from travelling via the path into the first volume 131. As used herein, substantially prevented or to substantially prevent means that the amount of light or process gases that are not prevented from travelling along the path are minimal enough to not impact processing.

For example, the light from the lamphead 138 that the path 128 is meant to limit or prevent may have wavelengths that can be measured by the upper pyrometer 156 (e.g., a temperature sensor). Other elements, such as the first liner 116 and the second liner 111, may also be used to limit or prevent light from the lamphead 138 from reaching the pyrometer 156, as discussed below.

The inventors have discovered that supporting the substrate without a susceptor plate advantageously prevents a thermal averaging effect that the susceptor plate can undesirably provide. However, the inventors have further discovered that the absence of the susceptor can undesirably allow for the transmission of light at certain wavelengths through the substrate. Accordingly, to accurately measure the temperature of the substrate during processing, a temperature sensor is provided that measures one or more wavelengths of light that radiates from the substrate but is not transmitted through the substrate. However, the inventors have discovered that light energy provided to heat the substrate that goes around the substrate can interfere with the accurate measurement of the substrate temperature. Thus, in some embodiments, the inventive apparatus advantageously limits or prevents light from the lamphead from reaching the temperature sensor.

In some embodiments, such as those illustrated in FIGS. 1 and 2A-B, the substrate support 124 includes the first ring 126 to support the substrate 101 proximate a peripheral edge of the substrate 101. Though illustrated as being parallel to the substrate 101, a substrate supporting surface 129 of the first ring 126 may be slanted with respect to the substrate 101 or configured in any suitable configuration to modify surface contact with the peripheral edge of the substrate 101. In some embodiments, the first ring 126 may be relatively thin, for example, such as having a thickness ranging from about 0.20 to about 1 millimeters, to reduce thermal mass such that the first ring 126 does significantly contribute to the temperature profile proximate the peripheral edge of the substrate 101. The first ring 126 may comprise materials, such as one or more of silicon carbide (SiC), silicon nitride (SiN), SiC coated graphite, glassy carbon coated graphite, SiN coated graphite, glassy carbon or the like.

The third ring 127 may be disposed between the first ring 126 and the second ring 122 as illustrated in FIGS. 1 and 2A-B. The third ring 127 may comprise materials, such as one or more of SiC, SiN, SiC coated graphite, glassy carbon coated graphite, SiN coated graphite, glassy carbon, SiC coated silica, glassy carbon coated silica, SiC coated ceramic alloys of silica, alumina, and magnesia, or the like. The third ring 127 may support the first ring 126. In some embodiments, the third ring 127 may include an inner lip 134 extending radially toward the first ring 126 from an inner surface 135 of the third ring 127. A protrusion 136 may extend upward from the inner lip 134 of the third ring 127 such that the first ring 126 is supported on the protrusion 136. The protrusion 136 may be continuously disposed about the inner lip 134. The end of the protrusion 136 may be configured such that heat transfer is limited between the third ring 127 and the first ring 126. For example, in some embodiments, the protrusion 136 may be beveled, or may taper, or have some other geometry such that the protrusion 136 has a first thickness proximate the inner lip 134 that is greater than a second thickness at an end of the protrusion 136 that contacts the first ring 126 to minimize the contact area between the first ring 126 and the third ring 127. Likewise, the protrusion 136 may be castellated or otherwise disposed to have limited contact with 126. As illustrated in FIGS. 1 and 2A-B, the end of the protrusion 136 may be a knife edge or the like, which limits the contact area with respect to the first ring 126.

The inner lip 134 and protrusion 136 may partially define a groove formed in the third ring 127 to receive a portion of the first ring 126. For example, a groove 137 may be defined between the protrusion 136, the inner lip 134 and the inner surface 135 of the third ring 127. The groove 137 may receive a second protrusion 139 extending downward from a substrate-opposing side of the first ring 126. A second path 141 may be formed between the groove and the second protrusion 139 of the first ring 126. The second path 141, similar to the first path 128, may limit or prevent light from traveling between the first and second volumes 131, 133. In some embodiments, the second path 141 may include one or more features 143 disposed on at least one of surfaces of the groove 137 or surfaces of the second protrusion 139 as illustrated in FIG. 2D to further obstruct light from traveling through the second path 141. In some embodiments, the one or more features 143 may include a radial protrusion that extends around the entire periphery of the surfaces of the groove 137 or surfaces of the second protrusion 139. Alternatively, or in combination, the one or more features 143 may include radial protrusions that extend only partially around the periphery of the surfaces of the groove 137 or surfaces of the second protrusion 139.

Returning to FIGS. 1 and 2A-B, the third ring 127 includes an outer lip 145 extending radially towards the second ring 122 from an outer surface 147 of the third ring 127. The second ring 122 may include a second inner lip 148 extending radially towards the third ring 127 from an inner surface 149 of the second ring 122. The second ring 122 may comprise materials, such as one or more SiC, SiN, SiC coated graphite, glassy carbon coated graphite, SiN coated graphite, glassy carbon, SiC coated silica, glassy carbon coated silica, SiC coated ceramic alloys of silica, alumina, and magnesia, or the like. In some embodiments, and as illustrated in FIGS. 1 and 2A-B, the path 128 may be formed by an overlap of the outer lip 145 of the third ring 127 and the second inner lip 148 of the second ring 122. As illustrated in FIG. 2C, one or more features 150 may be disposed on at least one of a surface of the outer lip 145, a surface of the second inner lip 148, the outer surface of the third ring 147, or the inner surface of the second ring 149 to further limit or prevent light from travelling between the first and second volumes 131, 133. The one or more features 143, 150 may be any suitable shape or design and/or arranged in any suitable pattern that facilitates limiting or preventing light from passing through the paths 128, 141.

The substrate support 124 may include a base 152 disposed below the first, second, and third rings 126, 122, 127 as illustrated in FIG. 1. The base 152 may be transparent to wavelengths of light provided by the lamphead 138. The base 152 may be formed of substantially transparent materials, such as one or more of fused silica, alumina, sapphire, yttria or the like. The base may be mounted to a lift assembly 154, which may include a shaft 158 centrally disposed relative to the base 152 and configured to raise and lower the substrate support 124. The shaft 158 may be coupled to a lift mechanism disposed external to the lower dome 132. Further, a rotation mechanism may be coupled to the shaft 158 to rotate the substrate support 124 during processing. In some embodiments, lift pins 160 may be mounted to and/or configured to rest on the dome 132 in a stationary position. In operation, the lift mechanism may lower the substrate support 124 relative to the lift pins 160 such that the lift pins 160 receive the substrate 101 for transfer in or out of the system 100. In some embodiments, the lift pins could be captured and moved by the support 124 but would be free to slide vertically to engage and support the substrate when the support is lowered.

One or more members 162 may extend from the base 152 to support the first ring 126 above the base 152. As illustrated in FIGS. 1 and 2A-B, the one or more members may directly support the third ring 127. The one or more members 162 may be a plurality of rods, solid cylinders, or other suitably shaped members for supporting the first ring 126 above the base 152. The one or more members 162 may be formed of materials, such as one or more of SiC, SiN, SiC coated graphite, glassy carbon coated graphite, silicon nitride coated graphite, glassy carbon, graphite, SiC coated silica, glassy carbon coated silica, SiC coated ceramic alloys of silica, alumina, and magnesia, silica, alumina, yttria, ceramic alloys of silica, alumina, and magnesia, or the like. The one or more members 162 may have a narrow cross section, low density, and/or low thermal mass, such that energy transfer between the base 152 or the one or more members 162 and the substrate 101 is limited or prevented through the one or more members 162. The one or more members 162 may have varying cross sections as discussed below in embodiments illustrated in FIG. 3. The one or more members 162 may be disposed symmetrically about the base 152.

As illustrated in FIGS. 1 and 2A-B, a skirt, or cylindrical body between a second protrusion 502 extending downward from the second inner lip 148 of the second ring 122 and a first protrusion 504 extending upward from the substrate-opposing end of the first ring 126 may be disposed below the third ring 127. The cylindrical body 164 may function to prevent process gases that may enter the first volume 131 from the second volume 133 from depositing on the backside of the substrate 101. For example, the cylindrical body 164 may facilitate the formation of a third path 166 that reduces process gas flow between the second volume 133 and the backside of the substrate 101.

In some embodiments, the cylindrical body 164 may extend downward from the third ring 127, and the third path 166 may be formed by the cylindrical body 164 and the substrate support 124 as illustrated in FIGS. 1 and 2A. Alternatively, in some embodiments, the third path 166 may be formed between the cylindrical body 164 and the third ring 127. For example, as illustrated in FIG. 2B, the cylindrical body 164 may extend upward from a peripheral edge of the base 152 towards the third ring 127. The embodiments of FIG. 2B may be desirable, for example, to further reduce the thermal mass of the third ring 127. In some embodiments, one or more features, similar to the one or more features 143, 150, may be disposed along surfaces of the third path 166 to further limit gas flow through the third path 166.

During processing, the substrate 101 is disposed on the substrate support 124. The lid 106, the clamp ring 108, and the lower dome 132 are formed from quartz; however, other IR-transparent and process compatible materials may also be used to form these components. The lamphead 138 is a source of infrared (IR) radiation (i.e., heat) and, in operation, generate a pre-determined temperature distribution across the substrate 101. The lamphead 138 may provide energy at wavelengths ranging from about 300 to about 5000 nanometers (nm). The lamphead 128 provides a sufficient energy range such that a first energy (at a first wavelength or range of first wavelengths) can be transmitted through the substrate and a second energy (at a second wavelength or range of second wavelengths) that is absorbed by the substrate 101. The substrate 101 may radiate at the second wavelength or range of wavelengths. The upper pyrometer 156 may be configured to measure the second energy and not the first energy. Accordingly, the paths 128, 141 may be utilized to limit or prevent light from the lamphead 138 (e.g., light at the second wavelength or range of second wavelengths not originating from the substrate 101) from reaching the upper pyrometer 156 which measures the temperature of the substrate 101 during processing.

Figure 3:
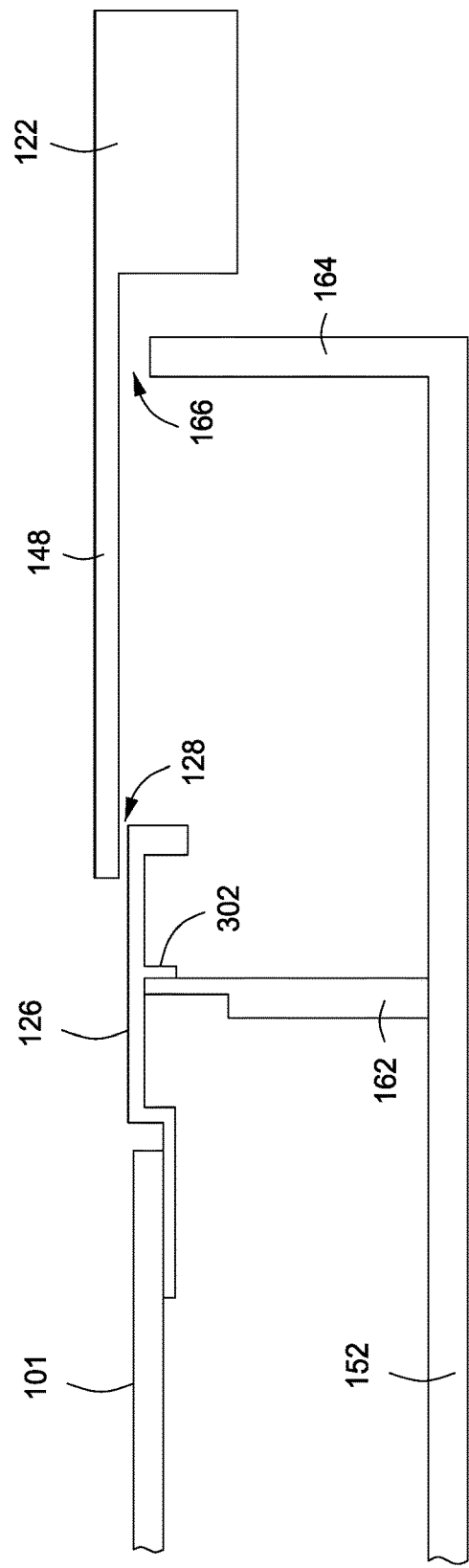
FIG. 3 depicts a partial side schematic view of a substrate support in accordance with some embodiments of the present invention.
Figure 4:
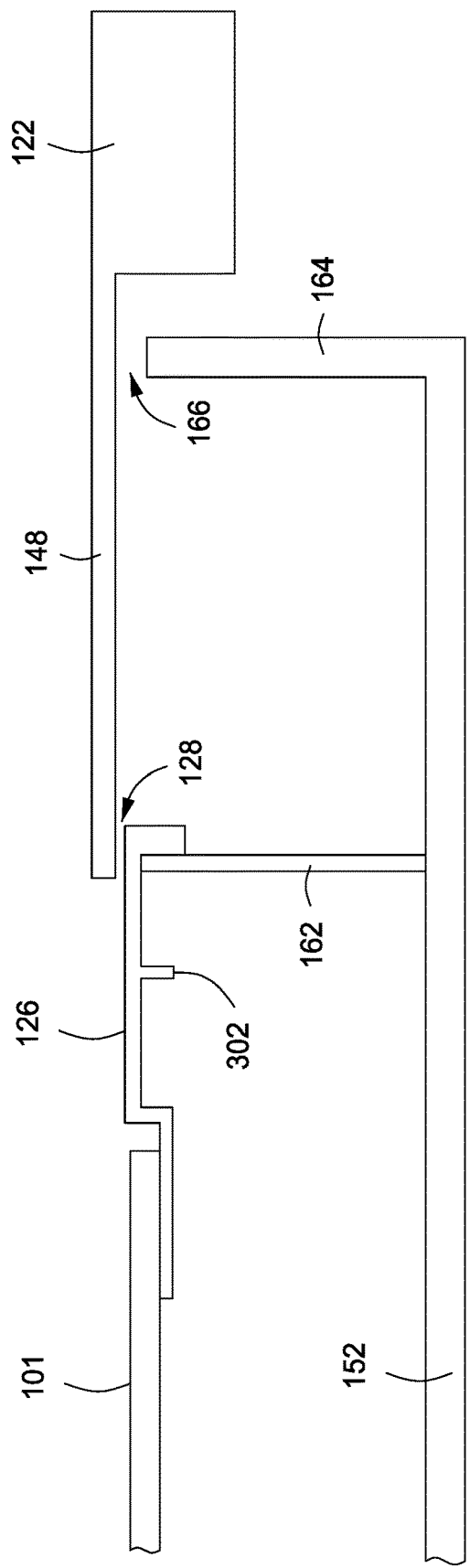
FIG. 4 depicts a partial side schematic view of a substrate support in accordance with some embodiments of the present invention.
Figure 5:
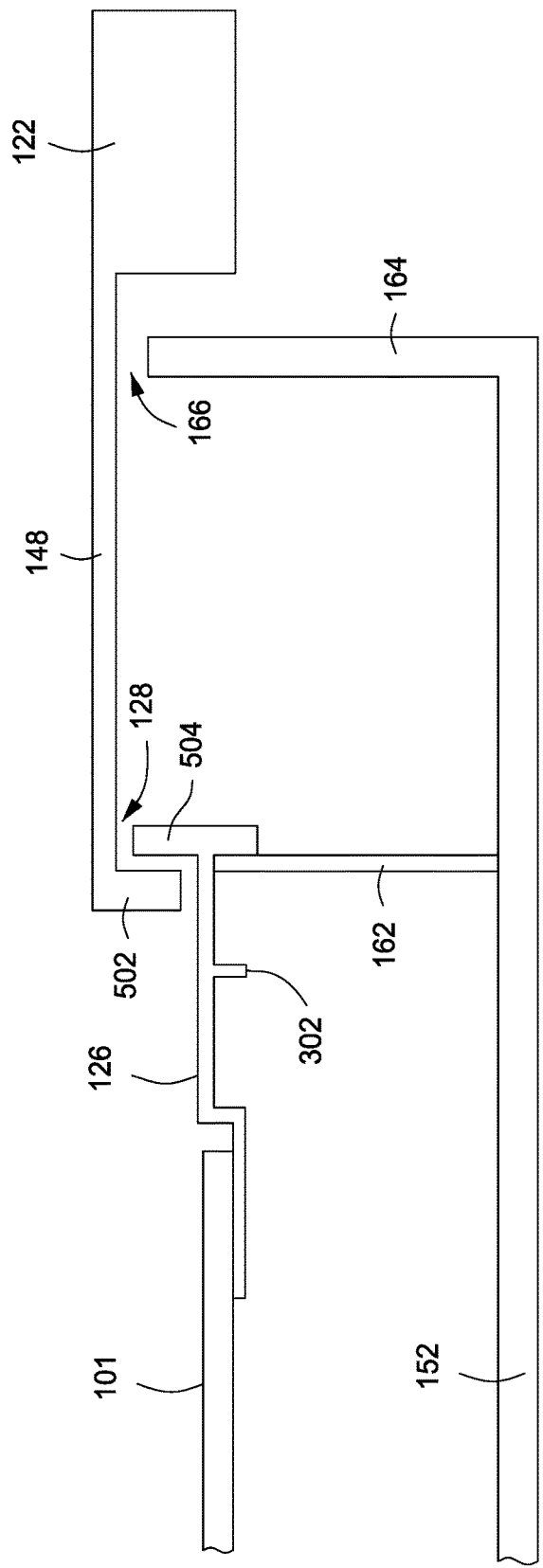
FIG. 5 depicts a partial side schematic view of a substrate support in accordance with some embodiments of the present invention.

Alternative embodiments of the inventive apparatus are illustrated in FIGS. 3-5. As illustrated in FIGS. 3-5, the path 128 may be formed by an overlap between a substrate-opposing end of the first ring 126 and the second ring 122. The first ring 126 may be disposed directly on the one or more members 162. Further, the base 152 may be extended such that the peripheral edge of the base 152 is disposed below the second ring 122. The cylindrical body 164 may extend upward from the peripheral edge of the base 152 to form the third path 166 between the cylindrical body 164 and the second ring 122. Accordingly, the one or more members 162 may be disposed inward from the peripheral edge of the base 152 as shown in FIGS. 3-5.

As illustrated in FIG. 3, the one or more members 162 may have a first cross section proximate the base 152 that is wider that that second cross section proximate the first ring 126. The narrow second cross section proximate the first ring 126 may facilitate reduced heat transfer between the one or more members 162 and the first ring 126. The one or more members 162 can support the first ring 126 centrally as illustrated in FIG. 3. A rib 302 extending downward from the first ring 126 and disposed thereabout may be utilized to provide additional support to the first ring 126. For example, additional support may be required to limit deformation of the first ring 126 as temperature increases in the system 100 during processing. In some embodiments, the rib 302 may be disposed proximate the one or more members 162 as shown in FIG. 3. The path 128 may be formed by an overlap between a substrate-opposing end of the first ring 126 and the second inner lip 148 extending radially inward from the inner surface 149 of the second member 122.

Alternative embodiments of the inventive apparatus are illustrated in FIG. 4. The embodiments illustrated in FIG. 4 may be substantially similar to those discussed above and illustrated in FIG. 3. However, the one or more members 162 may have a uniform cross section throughout, wherein the cross section is minimized to facilitate reduced heat transfer between the one or more members 162 and the first ring 126. Further, the first ring 126 may be supported by the one or more members 162 proximate a substrate-opposing end of the first ring 126.

Alternative embodiments of the inventive apparatus are illustrated in FIG. 5. The embodiments illustrated in FIG. 5 may be substantially similar to those discussed above and illustrated in FIG. 4. However, the path 128 may be formed between a second protrusion 502 extending downward from the second inner lip 148 of the second ring 122 and a first protrusion 504 extending upward from the substrate-opposing end of the first ring 126. Alternatively, or in combination, the second inner lip 148 and first ring 126 may include a plurality of second protrusions 502 and a plurality of first protrusions 504, respectively, which may be utilized to form the path 128. For example, the plurality of second protrusions 502 and the plurality of first protrusions 504 may form a path 128 that is serpentine-like, labyrinthine-like, comb-like or any suitable interleaved configuration.

Further, other elements of the system 100 may be utilized to limit or prevent light from exiting the first volume 131 and/or reaching the pyrometer 156. For example, the first liner 116 and the second liner 111 may comprise materials suitable for absorbing or reflecting light at the second wavelength or range of second wavelengths. The first and second liners 116, 111 may be formed of materials, such as one or more of opaque fused silica, black fused silica or the like.

Returning to FIG. 1, the support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The CPU 142 may be any form of a general purpose computer processor that can be used in an industrial setting. The support circuits 146 are coupled to the CPU 142 and may comprise cache, clock circuits, input/output subsystems, power supplies, and the like. Software routines, such as the methods for processing substrates disclosed herein, for example with respect to FIG. 2 below, may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some embodiments, for example where the process chamber 100 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

While the foregoing is directed to embodiments of the present invention, other and further embodiments of the invention may be devised without departing from the basic scope thereof.

The invention claimed is:

1. An apparatus for processing a substrate, comprising:
   a processing chamber having a substrate support comprising a first ring to support a substrate proximate a peripheral edge of the substrate, a base disposed below the first ring, and one or more and a plurality of support members extending from the base in contact with and supporting the first ring above the base;
   a second ring disposed about the substrate support, the second ring having an inner lip extending radially inward from an inner surface of the second ring;
   a lamphead to provide energy to a substrate when disposed on the substrate support, wherein the base is formed of material that is substantially transparent to wavelengths of light provided by the lamphead;
   a temperature sensor opposing the lamphead to measure energy radiated from the substrate; and
   a path formed between the first and second rings that allows the first ring to rotate with respect to the second ring, wherein the path substantially prevents light from travelling between a first volume disposed below the first and second rings and a second volume disposed above the first and second rings.

2. The apparatus of claim 1, wherein the path is formed by an overlap between a substrate-opposing end of the first ring and the inner lip.

3. The apparatus of claim 1, wherein the path is formed between at least one first protrusion extending upward from a substrate-opposing end of the first ring and at least one second protrusion extending downward from the inner lip of the second ring.

4. The apparatus of claim 1, wherein the first ring is disposed directly on the plurality of support members.

5. The apparatus of claim 4, wherein the first ring includes at least one first annular rib extending downward from a bottom surface of the first ring that is configured to limit deformation of the first ring during substrate processing.

6. The apparatus of claim 5, wherein the at least one first rib is disposed proximate the plurality of support members.

7. The apparatus of claim 1, wherein the plurality of support members have a first cross section proximate the base that is wider than a second cross section proximate the first ring.

8. The apparatus of claim 1, wherein the apparatus further comprises:
 a cylindrical body disposed below the second ring; and
 a third path formed between the cylindrical body and the second ring, wherein the third path reduces process gas flow between the second volume and a back side of a substrate when disposed on the first ring.

9. The apparatus of claim 8, wherein the cylindrical body extends upward from a peripheral edge of the base to form the third path between the cylindrical body and the second ring.

10. The apparatus of claim 1, wherein the peripheral edge of the base extends below the second ring.

11. The apparatus of claim 1, wherein the lamphead provides a first energy that transmits through a substrate when disposed on the substrate support and a second energy that is absorbed by a substrate when disposed on the substrate support.

12. The apparatus of claim 11, wherein the temperature sensor is configured to measure the second energy and not the first energy and wherein the base is transmissive to the first and second energies.

* * * * *

UNITED STATES PATENT AND TRADEMARK OFFICE
CERTIFICATE OF CORRECTION

PATENT NO. : 10,376,916 B2
APPLICATION NO. : 15/604900
DATED : August 13, 2019
INVENTOR(S) : Joseph M. Ranish et al.

It is certified that error appears in the above-identified patent and that said Letters Patent is hereby corrected as shown below:

In the Claims

In Claim 1, Column 8, Line 38, delete "and one or more and a plurality of", and replace with "and a plurality of".

Signed and Sealed this
Twenty-second Day of October, 2019

Andrei Iancu
*Director of the United States Patent and Trademark Office*